United States Patent [19]

Bruce et al.

[11] 4,407,850
[45] Oct. 4, 1983

[54] PROFILE CONTROL PHOTORESIST

[75] Inventors: Richard H. Bruce, Sandy Hook; Alan R. Reinberg, Westport, both of Conn.

[73] Assignee: The Perkin-Elmer Corporation, Norwalk, Conn.

[21] Appl. No.: 338,752

[22] Filed: Jan. 11, 1982

[51] Int. Cl.³ .......................... B05D 1/36; B05D 3/04
[52] U.S. Cl. .................................. 427/38; 204/192 E; 427/39; 430/313; 430/314
[58] Field of Search ................... 427/38, 39; 430/313, 430/314; 204/192 G

[56] References Cited

PUBLICATIONS

Moran et al, "High Resolution, Step Profile, Resist Patterns" Bell System Technical Journal, May, Jun. 1979, vol, 58, No, 5, pp. 1027-1036.

Primary Examiner—James R. Hoffman
Attorney, Agent, or Firm—S. A. Giarratana; E. T. Grimes; T. P. Murphy

[57] ABSTRACT

Anisotropic etching of thick photoresist under plasma conditions to achieve a vertical side wall with or without undercutting is accomplished by operating at a low excitation frequency, a pressure in the range of 0.3 to 2 Torr and a controlled concentration of active species.

10 Claims, 5 Drawing Figures

PROFILE CONTROL PHOTORESIST

BACKGROUND OF THE INVENTION

This invention relates to microcircuits in general and more particularly to an improved method of obtaining profile control in a photoresist using dry processing.

In the making of microcircuits, multilevel processes can have several advantages. Some of these are: the relaxation of constraints on resists to be both sensitive to the exposure medium and resistant to dry etching condition; the planarization of rough surface topography to allow better focusing using optics with small depths of field; and the formation of special resist profiles for lift-off processing. A typical series of steps in a multilevel process includes placing a planarizing layer on a substrate such as silicon covered with the usual thermal $SiO_2$, depositing a layer of material such as silicon dioxide or silicon nitride over the planarizing layer and then covering that layer with a photoresist. The photoresist is exposed and developed. In the areas in which the photoresist is developed, the silicon dioxide is exposed and then etched away chemically or otherwise. The remaining silicon dioxide then forms a mask permitting removal of the planarizing layer down to the thermal oxide.

Typically dry processing has been used in this process. A process which is referred to as reactive ion etching is described in an article entitled "High Resolution, Steep Profile, Resist Patterns" by J. M. Oran et al., *The Bell System Technical Journal,* Vol. 58, No. 5 May-June 1979. In the described process, a thick organic layer (a photoresist in the experiments) was covered with an intermediate layer of $SiO_2$ and a top thin layer of X-ray or photoresist. After exposure and development of the top resist layer, the intermediate layer was etched by $CHF_3$ ion etching. The thick organic layer was then etched by $O_2$ reactive ion etching. The authors reported submicron resolution with essentially vertical walls in the thick organic material. An experiment was carried out with a 1.6 micron layer of photoresist serving as the thick organic layer. Reactive RF sputter etching using pure oxygen as the gas forming the plasma and the $SiO_2$ as the mask was used to etch the organic layer. The RF power density was 0.5 watt/cm². It took twenty minutes to complete etching. SEM photographs show perpendicular walls with very little undercut. Typically reactive ion etching is done at less than 50 mTorr pressures with wafers resting on the powered electrode (cathode) at a 13.56 MHz frequency. This results in a slow process. Inverse undercutting has not previously been possible.

An inverse undercut is of particular interest in lift off processes, i.e., when trying to lift off the photoresist after putting down conductors. Preferably good separation between the edge of the deposited conductor and the remaining resist will have been established to permit ease of lift off. Otherwise, lift off becomes more difficult. (Previously this has typically been done using wet chemicals some of which are expensive and carcinogenic.)

Thus, it is an object of the present invention to provide an improved method of processing microcircuits which permits, preferably with dry processing, obtaining steep side walls and even an effective inverse undercut in the photoresist.

SUMMARY OF THE INVENTION

According to the present invention, anisotropic etching of the photoresist under plasma conditions which fulfills these objects is accomplished by limiting the active species responsible for the isotropic component. Along with the control of the concentration of the active species, control of the excitation frequency and the pressure are important parameters. In accordance with the present invention, a dry tri-level process which permits control of the final resist profile from a vertical wall to an effective (inverse) undercut wall is provided. The process can be carried out on conventional plasma etching equipment. The tri-level process of the present invention allows fine patterning in the thick resist without degradation from small depth of field. Effective (inverse) undercut is available to aid in lift off processess.

Essentially, the present invention carries out a plasma etching at a pressure much higher than that previously used in reactive ion etching. Pressures in the range of 0.3 to 2 Torr have been used. At these higher pressures sufficient active species can be present to undercut which may not occur at the lower pressures used previously. Furthermore, the process is preferably carried out at a lower frequency, for example, at about 100 KHz. The amount of undercut can be controlled through adjustment of the amount of active species by adjusting the pressure or the concentration of the reactant gases ($O_2/Ar$). Vertical etch rates on the order of 2,000 to 3,000 Å/min. are obtained.

DETAILED DESCRIPTION

Figure 1:
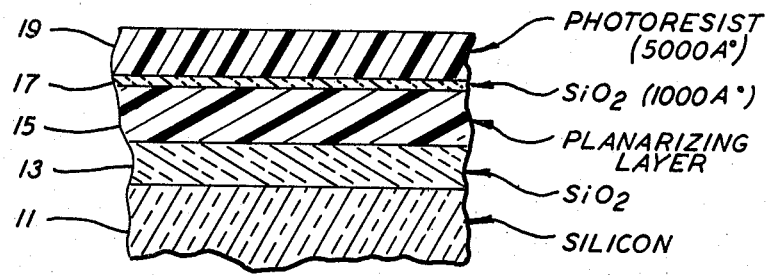
FIG. 1 is a cross-sectional view of a silicon wafer adapted for the tri-level process of the present invention.
Figures 2, 3A:
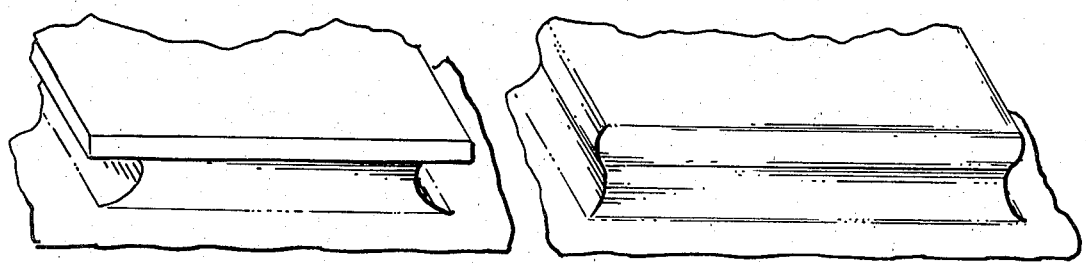
FIG. 2 is a view showing the etch profile obtained in a downstream reactor.
FIGS. 3a-3c are views showing profiles obtained with the method of the present invention.

FIG. 1 illustrates a silicon wafer 11 coated with a layer of thermal oxide 13, a 1 micron layer of resist 15, i.e., a planarizing layer, a masking layer 17, typically a 1,000 Å of $SiO_2$ and a 0.5 micron, i.e., 5,000 Å, layer of photoresist 19. The silicon dioxide layer 17 typically can be a plasma deposited low temperature $SiO_2$. The planarizing layer 15 may be Shipley AZ 1350 photoresist. The etching can be done using a small parallel plate reactor described in detail in an article by R. H. Bruce et al. in Proceeding Int'l Election Devices Meeting, Washington, D.C. 1981. Commercially available devices which can be used include the Omnitech 10,000 parallel plate reactor available from the Perkin-Elmer Corp. or the Sigma 80, available from IPC, converted to operate at low frequency. In operation, a 6 mm. electrode spacing and 0.62 W/cm² of 100 KHz excitation power were used. Table 1 below sets out various parameters for a number of different tests that were carried out. One set of etching experiments was done in a "downstream reactor" where the wafer was exposed to long-lived active species but received no ion bombardment. Throughout the test, oxygen mixed with argon was used as the reactant gas. In the parallel plate reactor where ion bombardment is present, it readily etches the resist. However, in the downstream reactor experiment, it was necessary to add $CF_4$ to produce substantial material removal. The etch profile resulting from downstream etching is illustrated in FIG. 2. This shows the characteristic undercutting of the oxide mask which occurs in a purely chemical process. This type of undercut, with the profile of the resist sloping toward the point of deposit is undesirable for lift off.

Figure 3B:
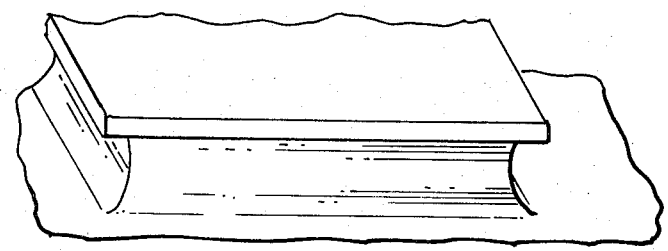
Figure 3C:
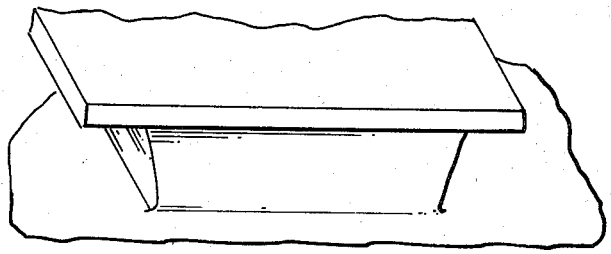

On the other hand, FIGS. 3a-c illustrates etch profiles of wafers exposed to ion bombardment in $O_2Ar$ mixtures. These show vertical profiles with an undercut which is dependent on various process parameters as set out in Table 1. When etching at 0.3 Torr with a 20 percent of $O_2$ and argon, acceptable anisotropic etching was accomplished even with 100 percent overetch using an oxide mask as seen in FIG. 3a. At 2 Torr, with this mixture, as illustrated by FIG. 3b and at 0.3 Torr with pure oxygen as illustrated by FIG. 3c a vertical profile with definite undercutting during the overetching took place. Such an evenly undercut profile will function effectively for liftoff in a manner similar to an exposed resist is immediately attacked. Note, also that as compared to the process described in the aforementioned article, the process in the present invention is much faster. There, a 2.6 micron, i.e., 26,000 Å/layer was removed in 20 minutes an etching rate of 1,300 Å/min. With the present invention, rates of up to 3,000 Å/min. were achieved. Higher rates should be possible with further adjustment of various parameters such as power density. Basically, it is believed that low pressures, in the range of 0.1 to 2 Torr, preferably about 0.3 Torr, with an oxygen concentration in the range of 10 to 20, preferably 20 percent, should be used. However, in accordance with the present invention and the data presented in Table 1, variation of oxygen concentration and pressure to achieve the desired degree of undercutting may be used. In all cases, operation at a relatively low frequency in the range of 100 KHz to the low MHz region should be used. As used herein, low frequency means a frequency in the range of 50 to 5,000 KHz.

TABLE 1

| Reactor | Mixture | Press | Freq. | Material | Profile | Undercut* | Rate |
|---|---|---|---|---|---|---|---|
| Downstream | $O_2$—$CF_4$ | | | $SiO_2$-AZ1350 | Isotropic | Yes | |
| Parallel Plate | 20% $O_2$/Ar | 0.3 T | 100 kHz | $SiO_2$-AZ1350 | Vertical | No | 2000Å/min. |
| Parallel Plate | 20% $O_2$/Ar | 2.0 T | 100 kHz | $SiO_2$-AZ1350 | Vertical | Moderate | 2000Å/min. |
| Parallel Plate | 100% $O_2$ | 0.3 T | 100 kHz | $SiO_2$-AZ1350 | Vertical | Moderate | 3000Å/min. |
| Parallel Plate | 20% $O_2$/Ar | 0.3 T | 13.6 MHz | $SiO_2$-AZ1350 | Vertical | Severe | 800Å/min. |

*100% overetch inverse undercut.

The vertical etch rate for the 20 percent mixture is 2,000 Å/min. at 0.62W/cm² input power independent of the pressure from 0.3 to 2 Torr. The etch rate increased to 3,000 Å/min. for the pure $O_2$ discharge at 0.3 Torr. The etch rate with the 20 percent oxygen mixture at 0.62 W/cm² and 13.56 MHz excitation was only 800 Å/min. and very severe undercutting was observed during overetching.

Thus, in accordance with the present invention to achieve good pattern transfer both control of pressure, e.g., 0.3 Torr, and reactant concentration e.g., 20 percent are desireable. The process can be modeled as a combination of bombardment induced (anisotropic) and chemical (isotropic) processes. Without the exposure to the discharge and ion bombardment only, the chemical process exists as seen in the downstream etching experiment. With ion bombardment, the anisotropic process is dominant in all cases until the photoresist is cleared, after which the chemical processes have varying degrees of effectiveness. The chemical process exhibits a strong dependence on pressure and $O_2$ concentration. Both processes depend on excitation frequency. Somewhat akin to doped polysilicon etching, with $Cl_2$ the bombardment induced process decreases at higher frequency where the ions bombard the wafer with less energy, while the chemical process increases.

Note that the sloped edge profile of the resist which is undercut isotropically in the downstream reactor, which is a purely chemical process, shown in FIG. 2 is quite different from the vertical profile resulting due to over etching at high pressure in a parallel plate reactor as shown in FIGS. 3a-c. This vertical undercutting suggests that a strong loading effect occurs in the parallel plate reactor where the species responsible for chemical action are depleted due to reactions with the resist. Consequently, little undercutting proceeds until after the surface is cleared of resist at which time chemical etching proceeds uniformly along the resist edge. This is in contrast to the downstream etching case where

What is claimed is:

1. A method of patterning a photoresist such as to obtain a vertical wall comprising:
   (a) depositing the photoresist in a thick layer on the order of one micron thick on a substrate;
   (b) depositing a thin layer of silicon dioxide over said thick resist;
   (c) depositing a thin layer of resist on said layer of silicon dioxide;
   (d) patterning said thin resist;
   (e) patterning said layer of silicon dioxide;
   (f) patterning said thick photoresist with steps comprising:
      (1) disposing said substrate between the plates of parallel plate reactor operating in the frequency range between 50 and 5000 KHz;
      (2) supplying a reactant gas containing to said reactor for generation of a plasma containing chemically active species;
      (3) establishing a pressure in said reactor in the range of 0.1 to 2 Torr.

2. The method according to claim 1 for obtaining a vertical profile without any undercutting comprising adjusting the concentration of said active species to approximately 20 percent and maintaining said pressure at about 0.3 Torr.

3. The method according to claim 1 comprising operating said reactor at least one of a pressure above approximately 0.3 Torr and a concentration of active species above approximately 20 percent to obtain a vertical side wall with undercut.

4. The method according to claim 1 wherein said active species comprises oxygen.

5. The method according to claim 4 comprising operating with the concentration of oxygen between approximately 20 percent and 100 percent, the remainder of the gas being an inert gas and at a pressure between approximately 0.3 Torr and 2 Torr.

6. The method according to claim 1 or 5 comprising operating at a frequency of about 100 KHz.

7. The method according to claim 1 or 5 wherein said thick photoresist is approximately one micron thick, said protective layer approximately 1,000 Å thick and said thin photoresist layer approximately 0.5 microns thick.

8. The method according to claim 1 or 5 wherein said process is carried out operating said reactor at approximately 0.62 w/cm$^2$.

9. The method according to claim 1 wherein said step of depositing a protective layer comprises plasma depositing low temperature $SiO_2$.

10. The method according to claim 1 wherein the spacing of the parallel plates in said reactor is approximately 6 mm.

* * * * *